w011127860B2

United States Patent
Chang et al.

(10) Patent No.: US 11,127,860 B2
(45) Date of Patent: Sep. 21, 2021

(54) EXTENDED-DRAIN FIELD-EFFECT TRANSISTORS INCLUDING A FLOATING GATE

(71) Applicant: GLOBALFOUNDRIES U.S. Inc., Santa Clara, CA (US)

(72) Inventors: Ming-Cheng Chang, Dresden (DE); Nigel Chan, Dresden (DE)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 37 days.

(21) Appl. No.: 16/568,591

(22) Filed: Sep. 12, 2019

(65) Prior Publication Data
US 2021/0083095 A1 Mar. 18, 2021

(51) Int. Cl.
| | | |
|---|---|---|
| *H01L 29/788* | (2006.01) | |
| *H01L 29/08* | (2006.01) | |
| *H01L 23/528* | (2006.01) | |
| *H01L 29/45* | (2006.01) | |
| *H01L 29/66* | (2006.01) | |
| *H01L 21/02* | (2006.01) | |

(Continued)

(52) U.S. Cl.
CPC ...... *H01L 29/788* (2013.01); *H01L 21/02532* (2013.01); *H01L 23/528* (2013.01); *H01L 29/0847* (2013.01); *H01L 29/456* (2013.01); *H01L 29/665* (2013.01); *H01L 29/66484* (2013.01); *H01L 29/66659* (2013.01); *H01L 29/66825* (2013.01); *H01L 29/7831* (2013.01); *H01L 29/7835* (2013.01); *H01L 21/02576* (2013.01); *H01L 21/266* (2013.01); *H01L 21/26513* (2013.01); *H01L 21/28035* (2013.01); *H01L 29/36* (2013.01); *H01L 29/4916* (2013.01); *H01L 29/6656* (2013.01)

(58) Field of Classification Search
CPC ... H01L 29/0873–0886; H01L 21/8236; H01L 29/7838
See application file for complete search history.

(56) References Cited

U.S. PATENT DOCUMENTS

| | | | |
|---|---|---|---|
| 7,714,394 B2 | 5/2010 | Shin et al. | |
| 8,754,533 B2 * | 6/2014 | Or-Bach | ............... H01L 27/105 257/777 |

(Continued)

FOREIGN PATENT DOCUMENTS

TW 200625636 A 7/2006

OTHER PUBLICATIONS

Taiwan Intellectual Property Office, Examination Report dated Apr. 22, 2021 in Taiwanese Patent Application No. 109127364.

*Primary Examiner* — Jarrett J Stark
(74) *Attorney, Agent, or Firm* — Thompson Hine LLP; Francois Pagette

(57) ABSTRACT

Structures for an extended-drain field-effect transistor and methods of forming an extended-drain field-effect transistor. A source region is coupled to a semiconductor layer, a drain region is coupled to the semiconductor layer, and a first gate structure is positioned over a channel region of the semiconductor layer. An extended drain region is positioned between the channel region and the drain region. The extended drain region includes a portion of the semiconductor layer between the first gate structure and the drain region. A second gate structure is arranged over the portion of the semiconductor layer.

20 Claims, 2 Drawing Sheets

(51) Int. Cl.
*H01L 29/78* (2006.01)
*H01L 21/266* (2006.01)
*H01L 21/265* (2006.01)
*H01L 29/36* (2006.01)
*H01L 29/49* (2006.01)
*H01L 21/28* (2006.01)

(56) References Cited

U.S. PATENT DOCUMENTS

| | | | |
|---|---|---|---|
| 9,799,524 B2 | 10/2017 | Ito et al. | |
| 9,806,170 B1 | 10/2017 | Mulfinger et al. | |
| 9,865,607 B1* | 1/2018 | Liu | H01L 21/84 |
| 10,312,365 B1* | 6/2019 | Liu | H01L 29/66681 |
| 10,727,253 B1* | 7/2020 | Nowak | H01L 21/7624 |
| 2006/0081836 A1* | 4/2006 | Kimura | H01L 21/823807 257/19 |
| 2008/0067587 A1* | 3/2008 | Gossner | H01L 29/7436 257/336 |
| 2012/0187485 A1* | 7/2012 | Morioka | H01L 29/7838 257/343 |
| 2014/0106494 A1* | 4/2014 | Bedell | H01L 21/84 438/49 |
| 2015/0287740 A1* | 10/2015 | Bedell | H01L 21/743 257/351 |
| 2016/0181395 A1* | 6/2016 | Liu | H01L 21/8258 257/347 |
| 2017/0018622 A1* | 1/2017 | Ito | H01L 29/42368 |
| 2017/0125252 A1* | 5/2017 | Strachan | H01L 29/7816 |
| 2018/0261676 A1* | 9/2018 | Sonsky | H01L 29/42368 |
| 2018/0286858 A1* | 10/2018 | Liu | H01L 29/0649 |
| 2019/0027585 A1* | 1/2019 | Wei | H01L 29/66659 |
| 2019/0051747 A1* | 2/2019 | Cortes Mayol | H01L 29/66696 |
| 2019/0057970 A1* | 2/2019 | Sun | H01L 29/66825 |
| 2019/0103490 A1* | 4/2019 | Warrick | H01L 29/407 |
| 2019/0172948 A1* | 6/2019 | Paul | H01L 21/743 |
| 2019/0181131 A1* | 6/2019 | Galy | H01L 29/78624 |

* cited by examiner

EXTENDED-DRAIN FIELD-EFFECT TRANSISTORS INCLUDING A FLOATING GATE

BACKGROUND

The present invention relates to semiconductor device fabrication and integrated circuits and, more specifically, to structures for an extended-drain field-effect transistor and methods of forming an extended-drain field-effect transistor.

Complementary-metal-oxide-semiconductor (CMOS) processes may be employed to build a combination of p-type and n-type field-effect transistors that are connected as logic devices. Device structures for a field-effect transistor generally include a source, a drain, and a gate electrode configured to switch carrier flow in a channel region arranged between the source and drain. When a control voltage exceeding a designated threshold voltage is applied to the gate electrode, carrier flow occurs in the channel region to produce a device output current.

High-voltage integrated circuits used, for example, in microwave/radiofrequency power amplifiers typically require specialized circuit technology capable of withstanding higher voltages than logic field-effect transistors. A field-effect transistor may be modified to include additional features, such as an extended drain, that promote the higher voltage handling capability.

Improved structures an extended-drain field-effect transistor and methods of forming an extended-drain field-effect transistor are needed.

SUMMARY

In an embodiment of the invention, a structure for an extended-drain field-effect transistor is provided. The structure includes a semiconductor layer having a channel region, a source region coupled to the semiconductor layer, a drain region coupled to the semiconductor layer, and a first gate structure positioned over the channel region. The structure further includes an extended drain region positioned between the channel region and the drain region. The extended drain region includes a portion of the semiconductor layer between the first gate structure and the drain region. The structure further includes a second gate structure arranged over the portion of the semiconductor layer.

In an embodiment of the invention, a method of forming an extended-drain field-effect transistor is provided. The method includes forming a first gate structure positioned over a channel region in a semiconductor layer, forming a source region coupled to the semiconductor layer, forming a drain region coupled to the semiconductor layer, and forming a second gate structure arranged over a portion of the semiconductor layer between the first gate structure and the drain region. The portion of the semiconductor layer is included in an extended drain region that is positioned between the channel region and the drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
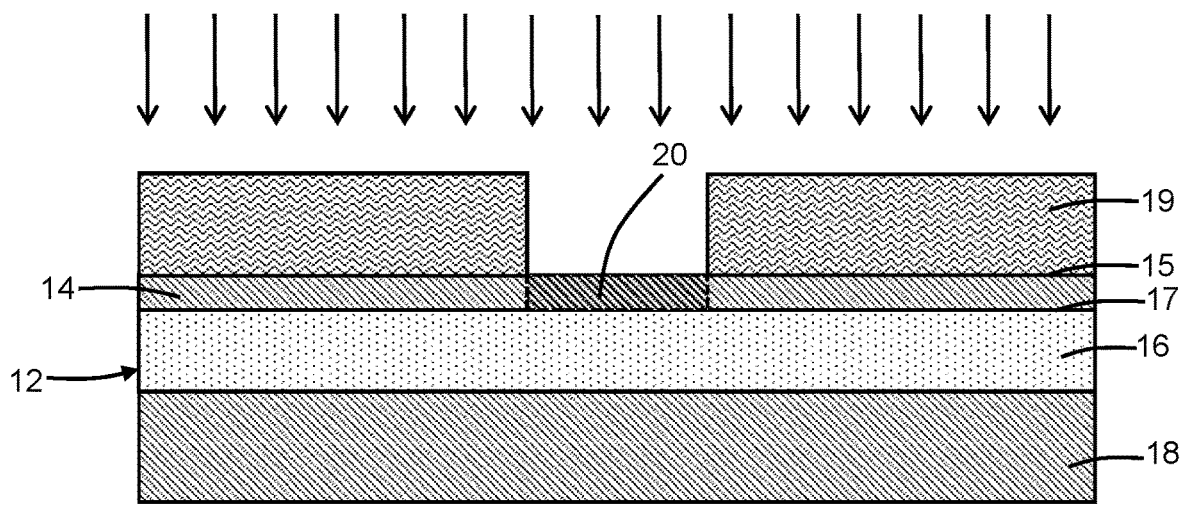
FIGS. 1-3 are cross-sectional views of a device structure at successive fabrication stages of a processing method in accordance with embodiments of the invention.

With reference to FIG. 1 and in accordance with embodiments of the invention, a wafer 12 is provided for forming a device structure for an extended-drain field-effect transistor. In an embodiment, the wafer 12 may be a semiconductor-on-insulator (SOI) wafer that includes a device layer 14, a buried insulator layer 16, and a substrate 18. The device layer 14 is separated from the substrate 18 by the intervening buried insulator layer 16, and the device layer 14 may be considerably thinner than the substrate 18. The device layer 14 has a top surface 15 and shares a boundary with the buried insulator layer 16 along an interface 17.

The device layer 14 and the substrate 18 may be composed of a single-crystal semiconductor material, such as single-crystal silicon, and the buried insulator layer 16 may be constituted by a buried oxide (BOX) layer. The device layer 14 may be composed of intrinsic semiconductor material that is undoped and that does not exhibit either n-type conductivity or p-type conductivity. In an embodiment, the device layer 14 may have a thickness that ranges from about 3 nanometers (nm) to about 200 nm. In an embodiment, the wafer 12 may be an extremely thin semiconductor-on-insulator (ETSOI) wafer with a thin device layer 14 and a thin buried insulator layer 16, and the ETSOI wafer may be used to fabricate fully-depleted SOI (FDSOI) devices. In an embodiment, the device layer 14 of the ETSOI wafer may have a thickness in an ultra-thin regime (i.e., about 3 nm to about 10 nm) suitable to manufacture FDSOI devices.

A doped region 20 is formed in a portion of the device layer 14. In an embodiment, the doped region 20 may extend across the entire thickness of the device layer 14 to the buried insulator layer 16. In particular, the doped region 20 may extend from the top surface 15 of the device layer 14 to the interface 17 between the device layer 14 and the buried insulator layer 16.

The doped region 20 may be formed by, for example, ion implantation with an implantation mask 19 covering an area over the device layer 14 to determine the implanted area of the device layer 14. The implantation mask 19 may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the doped region 20. The implantation mask 19 may be stripped after forming the doped region 20.

In an embodiment, the semiconductor material of the doped region 20 may be doped with an n-type dopant (e.g., phosphorus (P) and/or arsenic (As)) that provides n-type conductivity. In an embodiment, the semiconductor material of the doped region 20 may be doped with a p-type dopant (e.g., boron (B)) that provides p-type conductivity. In an embodiment, the doped region 20 may be lightly doped to contain a dopant concentration in a range equal to about $1\times10^{17}$ atoms/cm$^3$ to about $5\times10^{18}$ atoms/cm$^3$.

Figure 2:
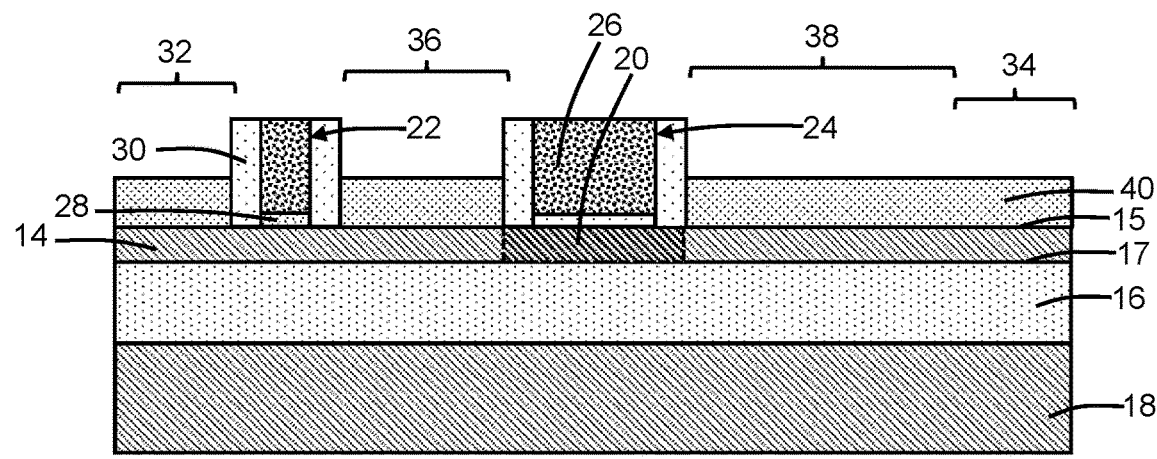

With reference to FIG. 2 in which like reference numerals refer to like features in FIG. 1 and at a subsequent fabrication stage, a gate structure 22 and a gate structure 24 are formed over the device layer 14 after the doped region 20 is formed. The gate structure 22 is positioned directly over a section of the device layer 14 that provides a channel region. The gate structure 24 is positioned directly over the doped region 20 in the device layer 14 and is overlapped with all or part the doped region 20.

The gate structures 22, 24 each includes a gate electrode 26 and a gate dielectric 28 arranged between the gate electrode 26 and the device layer 14. The gate structures 22, 24 may be formed by depositing a layer stack of different component materials and patterning the deposited layer stack with lithography and etching. Each gate electrode 26 may contain polysilicon deposited by chemical vapor deposition and highly doped with either a p-type or n-type dopant during deposition to elevate its electrical conductivity. Each gate dielectric 28 may be composed of a dielectric material, such as silicon dioxide either grown from the device layer 14 or deposited by atomic layer deposition. The gate structure 24 may be in direct contact with the doped region 20 with the gate dielectric 28 arranged between the gate electrode 26 and the top surface 15 of the device layer 14.

Sidewall spacers 30 are arranged adjacent to the side surfaces or sidewalls of the gate structures 22, 24. The sidewall spacers 30 may be formed by depositing a conformal layer composed of a dielectric material, such as silicon nitride, and etching the deposited conformal layer with an anisotropic etching process, such as reactive ion etching.

A semiconductor layer 40 is formed on the device layer 14 that provides a source region 32, a drain region 34, and disconnected sections 36, 38. The gate structure 22 is arranged between the source region 32 and the section 36 of the semiconductor layer 40. The sections 36, 38 of the semiconductor layer 40 define an extended drain region that also includes the doped region 20 and the portion of the device layer 14 in which the doped region 20 is formed.

The semiconductor layer 40 may be formed by the epitaxial growth from the top surface of the device layer 14. The semiconductor layer 40 may be in situ doped during epitaxial growth with a concentration of a dopant. In an embodiment, the semiconductor layer 40 may be in situ doped during epitaxial growth with an n-type dopant (e.g., phosphorus and/or arsenic) that provides n-type conductivity. In an embodiment, the semiconductor layer 40 may be composed of silicon and may be doped during epitaxial growth with a concentration of an n-type dopant. In an embodiment, the semiconductor layer 40 may be composed of silicon and may be doped during epitaxial growth with a concentration of a p-type dopant. In an embodiment, the doped region 20 may be lightly-doped with a dopant, and the semiconductor layer 40 may be heavily doped with the dopant to contain a dopant concentration that is equal to about $1 \times 10^{10}$ atoms/cm$^3$ to about $1 \times 10^{20}$ atoms/cm$^3$.

Figure 3:
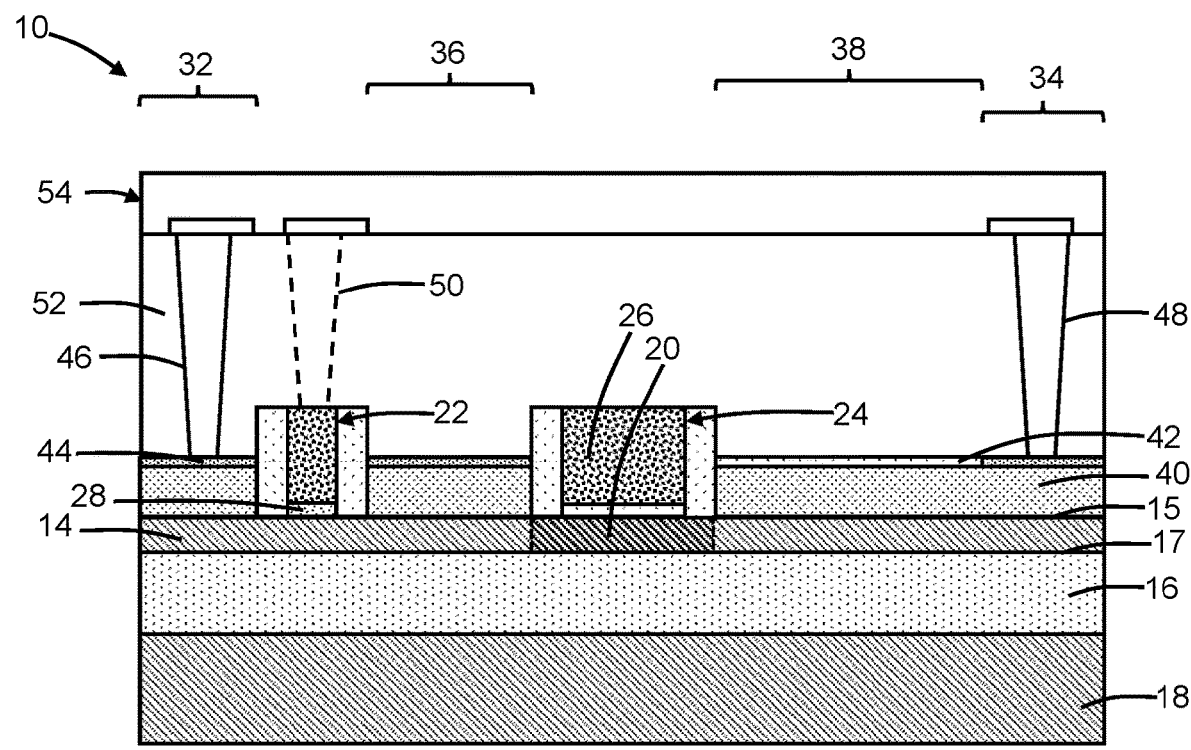

With reference to FIG. 3 in which like reference numerals refer to like features in FIG. 2 and at a subsequent fabrication stage, a dielectric layer 42 is formed over the section 38 of the semiconductor layer 40 and is in direct contact with the section 38. The dielectric layer 42 may be composed of a dielectric material (e.g., silicon nitride) that is deposited by atomic layer deposition. Sections of a silicide layer 44 are subsequently formed on the source region 32, the drain region 34, and the section 36 of the semiconductor layer 40. The dielectric layer 42 blocks the formation of silicide on the section 38 of the semiconductor layer 40, which assists in localizing the extent of the drain region 34.

The silicide layer 44 may be formed by a silicidation process in which a layer of a silicide-forming metal is deposited by, for example, chemical vapor deposition or physical vapor deposition on the source region 32, the drain region 34, the section 36 of the semiconductor layer 40, and the dielectric layer 42 on the section 38 of the semiconductor layer 40 followed by one or more annealing processes (e.g., rapid thermal annealing). During annealing, a silicide phase formed by reacting the layer of silicide-forming metal and the contacted semiconductor material of the semiconductor layer 40. Candidate materials for the silicide-forming metal include, but are not limited to, nickel, titanium, cobalt, palladium, platinum, or other metals capable of reacting with silicon to form a low-resistivity, thermally-stable silicide. Residual silicide-forming metal remaining after forming the silicide layer 44 may be removed by wet chemical etching. In an embodiment, the source region 32, the drain region 34, and the section 36 of the semiconductor layer 40 are only partially silicided such that a thickness of the single-crystal epitaxial semiconductor material remains intact and non-reacted beneath the sections of the silicide layer 44 following silicidation. The silicidation process is self-aligned as the silicide-forming metal does not react with the dielectric material of the dielectric layer 42 and gate caps (not shown) that may be formed on the gate structures 22, 24.

Contacts 46, 48, 50 may be formed by middle-of-line (MOL) processing in an interlayer dielectric layer 52 and are respectively coupled to the source region 32, the drain region 34, and the gate electrode 26 of the gate structure 22. A back-end-of-line (BEOL) interconnect structure 54 may be subsequently formed over the interlayer dielectric layer 52 that includes one or more interlayer dielectric layers each composed of a dielectric material, and interconnects and vias composed of a metal (such as copper, tungsten, or cobalt) that are connected with the contacts 46, 48, 50.

The interlayer dielectric layer 52 lacks a contact coupled to the gate structure 24. Because the gate structure 24 is not coupled to a contact, the gate structure 24 is not coupled to, or otherwise connected with, the interconnect structure 54. The gate electrode 26 of the gate structure 24 is electrically isolated from the device layer 14 by the gate dielectric 28, and the interlayer dielectric layer 52 also provides electrical isolation for the gate electrode 26 of the gate structure 24. As a result, the gate structure 24 is floating during device operation.

The resulting device structure 10 is an extended-drain field-effect transistor that includes the gate structure 22, the source region 32, the drain region 34, and an extended drain region that includes the doped region 20 and sections 36, 38 of the semiconductor layer 40. The drain region 34 may be coupled by the interconnect structure with a high-voltage source. The substrate 18 may be coupled through the interconnect structure 54 with the source region 32 to provide a common source circuit configuration. The voltage on the gate electrode 26 of the gate structure 22 controls the current flowing from the drain region 34 to the source region 32.

The doped region 20 in the device layer 14 participates along with the sections 36, 38 of the semiconductor layer 40 to form an extended drain region (i.e., drift region) that generates a voltage drop between the source region 32 and drain region 34 across an extended distance within the body of the extended-drain field-effect transistor. The doped region 20, which is lightly doped, has an elevated electrical resistivity that contributes to the voltage drop, and that may permit the extended-drain field-effect transistor to operate with a significantly higher source-drain breakdown voltage. The doped region 20 may be fully depleted of carriers during device operation and effectively function as a resistor. The gate structure 24 influences the current path in the drift region, and the gate structure 24 also contributes to permitting the extended-drain field-effect transistor to operate with a significantly higher source-drain breakdown voltage.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an extended-drain field-effect transistor, the structure comprising:
 a semiconductor layer composed of an intrinsic semiconductor material;
 a source region including a first section of a doped semiconductor material over the intrinsic semiconductor material of the semiconductor layer;
 a drain region including a second section of the doped semiconductor material over the intrinsic semiconductor material of the semiconductor layer;
 a first gate structure positioned over the semiconductor layer;
 an extended drain region including a portion of the semiconductor layer between the first gate structure and the drain region; and
 a second gate structure positioned over the portion of the semiconductor layer,
 wherein the extended drain region includes a doped region in the portion of the semiconductor layer, the doped region is positioned beneath the second gate structure, and the doped region, the first section of the doped semiconductor material, and the second section of the doped semiconductor material are doped with a dopant.

2. The structure of claim 1 further comprising:
 an interconnect structure over the semiconductor layer,
 wherein the second gate structure lacks a connection with the interconnect structure.

3. The structure of claim 1 further comprising:
 an interlayer dielectric layer over the semiconductor layer;
 a first contact in the interlayer dielectric layer, the first contact coupled to the source region;
 a second contact in the interlayer dielectric layer, the second contact coupled to the drain region; and
 a third contact in the interlayer dielectric layer, the third contact coupled to the first gate structure,
 wherein the interlayer dielectric layer lacks a contact connection with the second gate structure.

4. The structure of claim 1 wherein the extended drain region further includes a third section of the doped semiconductor material that is positioned between the second gate structure and the drain region.

5. The structure of claim 1 wherein the dopant is an n-type dopant.

6. The structure of claim 1 wherein the semiconductor layer is a device layer of a silicon-on-insulator wafer.

7. The structure of claim 6 wherein the doped region extends from a top surface of the device layer to an interface between the device layer and a buried-insulator layer of the silicon-on-insulator wafer.

8. The structure of claim 4 further comprising:
 a silicide layer over the drain region, the silicide layer in direct contact with the second section of the doped semiconductor material; and
 a dielectric layer over the third section of the semiconductor layer.

9. The structure of claim 8 wherein the dielectric layer is in direct contact with the third section of the semiconductor layer.

10. The structure of claim 1 wherein the dopant is a p-type dopant.

11. The structure of claim 1 wherein the first gate structure is positioned over the semiconductor layer adjacent to the source region.

12. The structure of claim 1 wherein the first gate structure is positioned between the second gate structure and the source region.

13. The structure of claim 1 wherein the second gate structure is positioned between the first gate structure and the drain region.

14. The structure of claim 4 wherein the extended drain region further includes a fourth section of the doped semiconductor material that is positioned over the semiconductor layer between the first gate structure and the second gate structure.

15. The structure of claim 14 wherein the fourth section of the doped semiconductor material is disconnected from the third section of the doped semiconductor material.

16. The structure of claim 4 wherein the third section of the doped semiconductor material is doped with the dopant.

17. The structure of claim 16 wherein the first section of the doped semiconductor material, the second section of the doped semiconductor material, and the third section of the doped semiconductor material are heavily-doped with the dopant.

18. The structure of claim 1 wherein the doped region is lightly-doped with the dopant.

19. The structure of claim 1 wherein the first section of the doped semiconductor material and the second section of the doped semiconductor material are heavily-doped with the dopant.

20. The structure of claim 19 wherein the doped region is lightly-doped with the dopant.

\* \* \* \* \*